(12) United States Patent
Goel

(10) Patent No.: US 8,566,657 B2
(45) Date of Patent: Oct. 22, 2013

(54) CIRCUIT AND METHOD FOR DIAGNOSING SCAN CHAIN FAILURES

(75) Inventor: Sandeep Kumar Goel, San Jose, CA (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 203 days.

(21) Appl. No.: 13/093,942

(22) Filed: Apr. 26, 2011

(65) Prior Publication Data

US 2012/0278671 A1 Nov. 1, 2012

(51) Int. Cl.
*G01R 31/28* (2006.01)

(52) U.S. Cl.
USPC .......................................... 714/729; 714/736

(58) Field of Classification Search
USPC .................................. 714/726–731
See application file for complete search history.

(56) References Cited

U.S. PATENT DOCUMENTS

| | | | |
|---|---|---|---|
| 5,881,067 A | 3/1999 | Narayanan et al. | |
| 5,983,377 A * | 11/1999 | Knotts | 714/726 |
| 6,961,886 B2 | 11/2005 | Motika et al. | |
| 7,007,214 B2 * | 2/2006 | Eustis et al. | 714/729 |
| 7,107,502 B2 * | 9/2006 | Burdine | 714/726 |
| 7,313,744 B2 * | 12/2007 | Huisman et al. | 714/726 |
| 7,386,775 B2 * | 6/2008 | Birmiwal et al. | 714/729 |
| 7,392,448 B2 | 6/2008 | De Poorter et al. | |
| 7,392,449 B2 * | 6/2008 | Burdine et al. | 714/726 |
| 2006/0136795 A1 * | 6/2006 | Gunda et al. | 714/726 |
| 2008/0209288 A1 * | 8/2008 | Burlison et al. | 714/726 |

OTHER PUBLICATIONS

Edirisooriya S. et al., "Diganosis of Scan Path Failures", Proc. 13th IEEE VLSI Test Symp. (VTS95), IEEE Presss, 1995, pp. 250-255.
Narayanan S. et al., "An Efficient Scheme to Diagnose Scan Chains", Proc. Int'l Test Conf. (ITC 97), IEEE CS Press, 1997, pp. 704-713.
Wu, Y., "Diagnosis of Scan Chain Failures", Proc. Int'l Symp. Defect and Fault Tolerance in VLSI Systems (DFT98), IEEE Press, 1998, pp. 217-222.
Huang, Y., "Dynamic Learning Based Scan Chain Diagnosis", Proc. Design, Automation and Test in Europe Conf. (Date 07), IEEE CS Press, 2007, pp. 510-555.
Stanley, K., "High Accuracy Flush-and-Scan Software Diagnostic", IEEE Design & Test, Nov.-Dec. 2001, 18(6):56-62.
Guo, R. et al., "An Algorithic Technique for Diagnosis of Faulty Scan Chains", IEEE Trans. Computer-Aided Design of Integrated Circuits and Systems, Sep. 2006, 25(9):1861-1868.
Kao, Y.L. et al., "Jump Simulation: A Technique for Fast and Precise Scan Chain Fault Diagnosis", Proc. Int'l. Test Conf., (ITC 06), IEEE CS Press, 2006, Paper 22.1, 9 pages.
Song, P., "A New Scan Structure for Improving Scan Chain Diagnosis and Delay Fault Coverage", Proc. 9th IEEE North Atlantic Test Workshop (NATW 00), 2000, pp. 14-18.

* cited by examiner

*Primary Examiner* — Steve Nguyen
(74) *Attorney, Agent, or Firm* — Duane Morris LLP

(57) ABSTRACT

A method includes shifting a first logic sequence into a first scan chain having a first plurality of scan blocks coupled together, outputting a second logic sequence from each of the plurality of scan blocks in the first scan chain to a respective scan block in a second scan chain, and shifting a third logic sequence out of the second scan chain. At least one improperly functioning scan block of the first scan chain is identified based on the third logic sequence shifted out of the second scan chain.

12 Claims, 11 Drawing Sheets

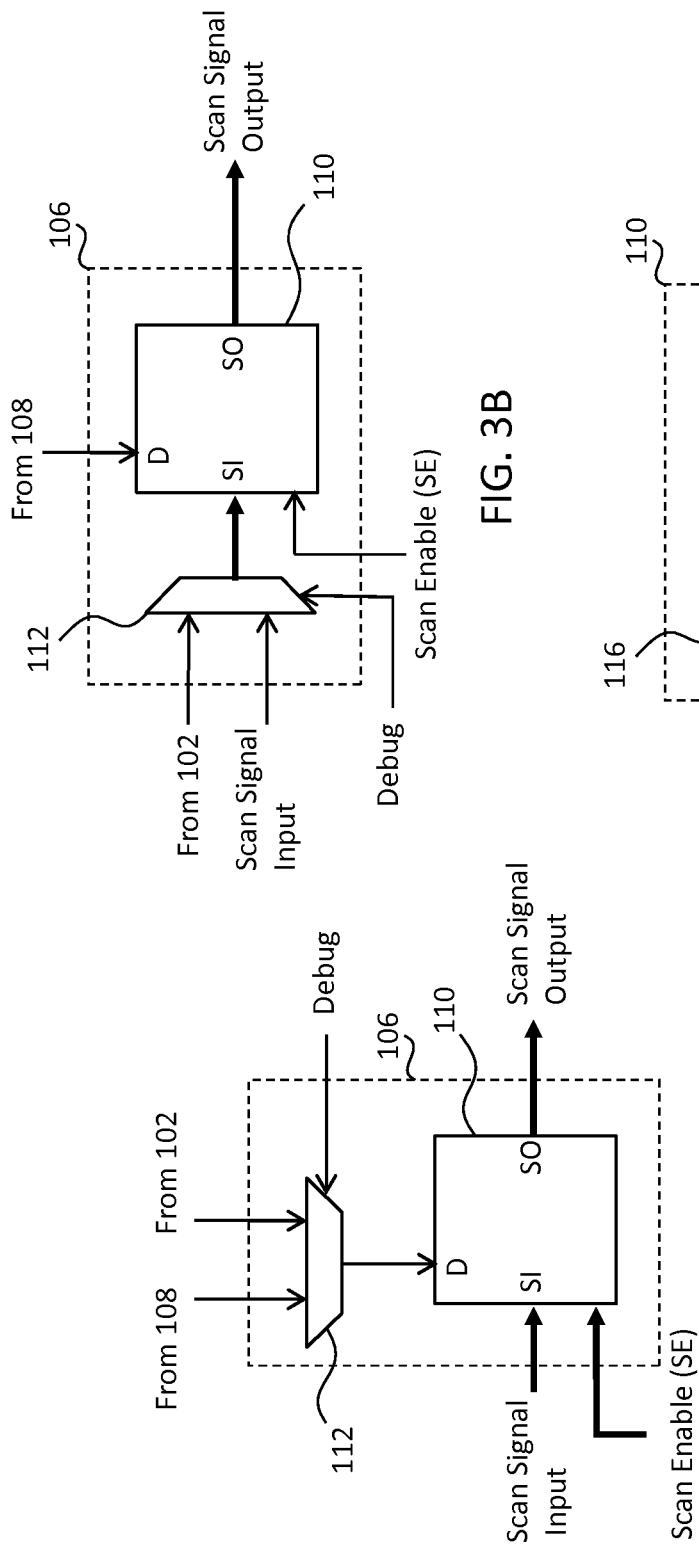
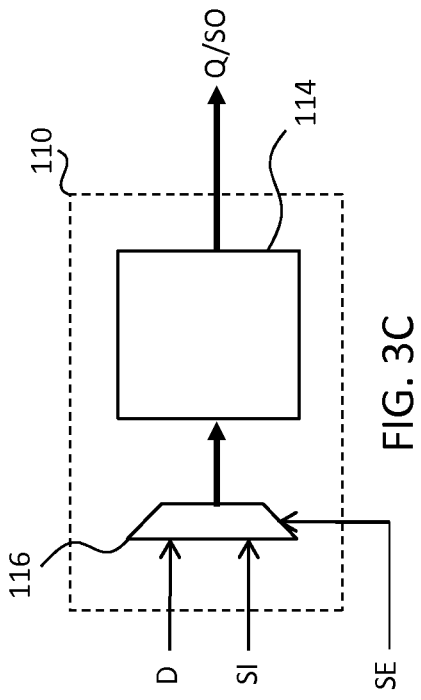
FIG. 3A
FIG. 3B
FIG. 3C

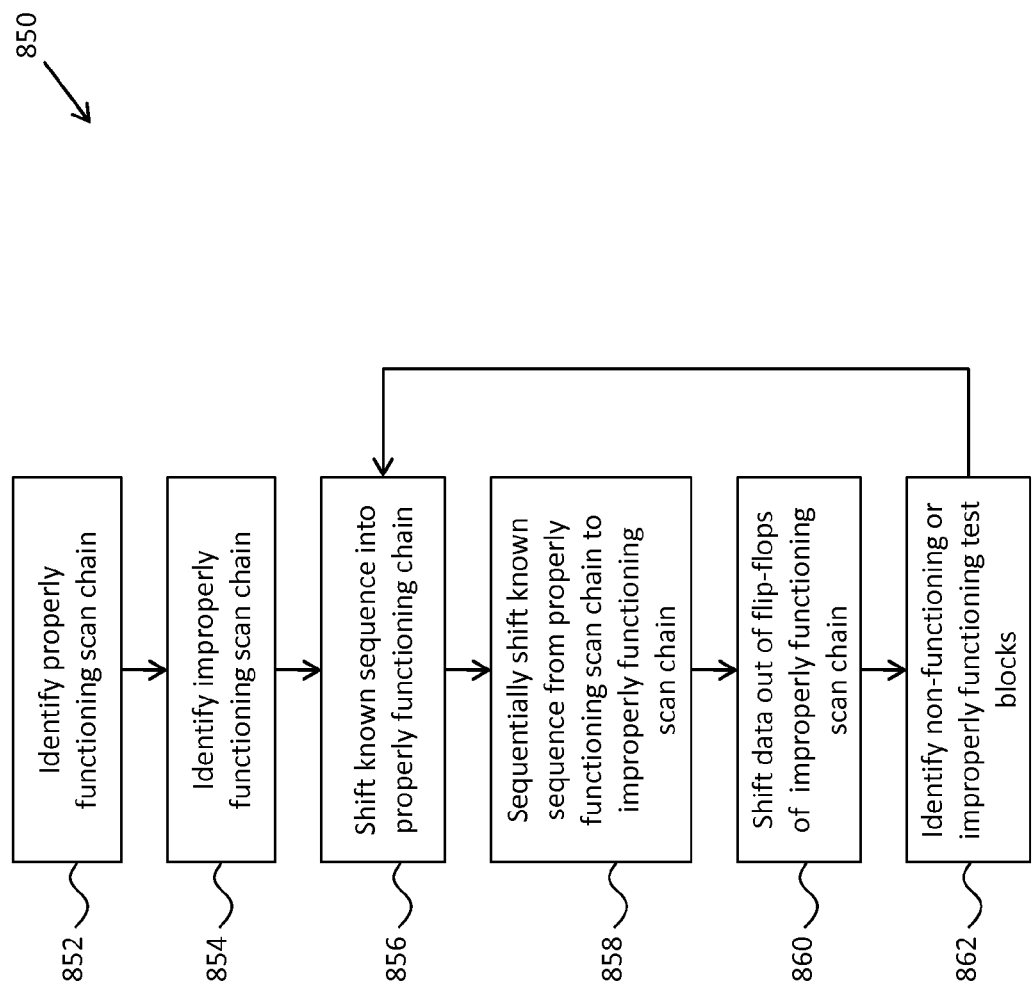

CIRCUIT AND METHOD FOR DIAGNOSING SCAN CHAIN FAILURES

FIELD OF DISCLOSURE

The disclosed circuit and method relate to integrated circuits. More specifically, the disclosed circuit and method relate to diagnosing a scan chain failure on a integrated circuit.

BACKGROUND

Very large scale integrated ("VLSI") circuits include scan chains for testing some or all parts of the integrated circuit. A scan chain includes a plurality of flip-flops that are shifted to set the integrated circuit in a given state and determine if each part of the integrated circuit operates correctly. However, scan chains are only effective if the scan chains themselves are operable and do not include defects. A defect in a scan chain can prevent proper testing of the integrated circuit as it may prevent a circuit from being set in a given state.

BRIEF DESCRIPTION OF THE DRAWINGS

FIGS. 3A and 3B illustrate examples of scan blocks in accordance with FIGS. 1 and 2.

FIG. 3C illustrates one example of a storage element in accordance with the scan blocks illustrated in FIGS. 3A and 3B.

FIGS. 8A and 8B are flow diagrams of examples of methods of identifying an improperly functioning scan block in accordance with the sequential access scan block architecture illustrated in FIG. 5.

DETAILED DESCRIPTION

The disclosed circuit and method advantageously enable a scan chain to be analyzed such that a root cause of a scan chain failure can be identified. Consequently, cycle time of yield ramping can be reduced to move new technologies to mass production.

Figure 1:
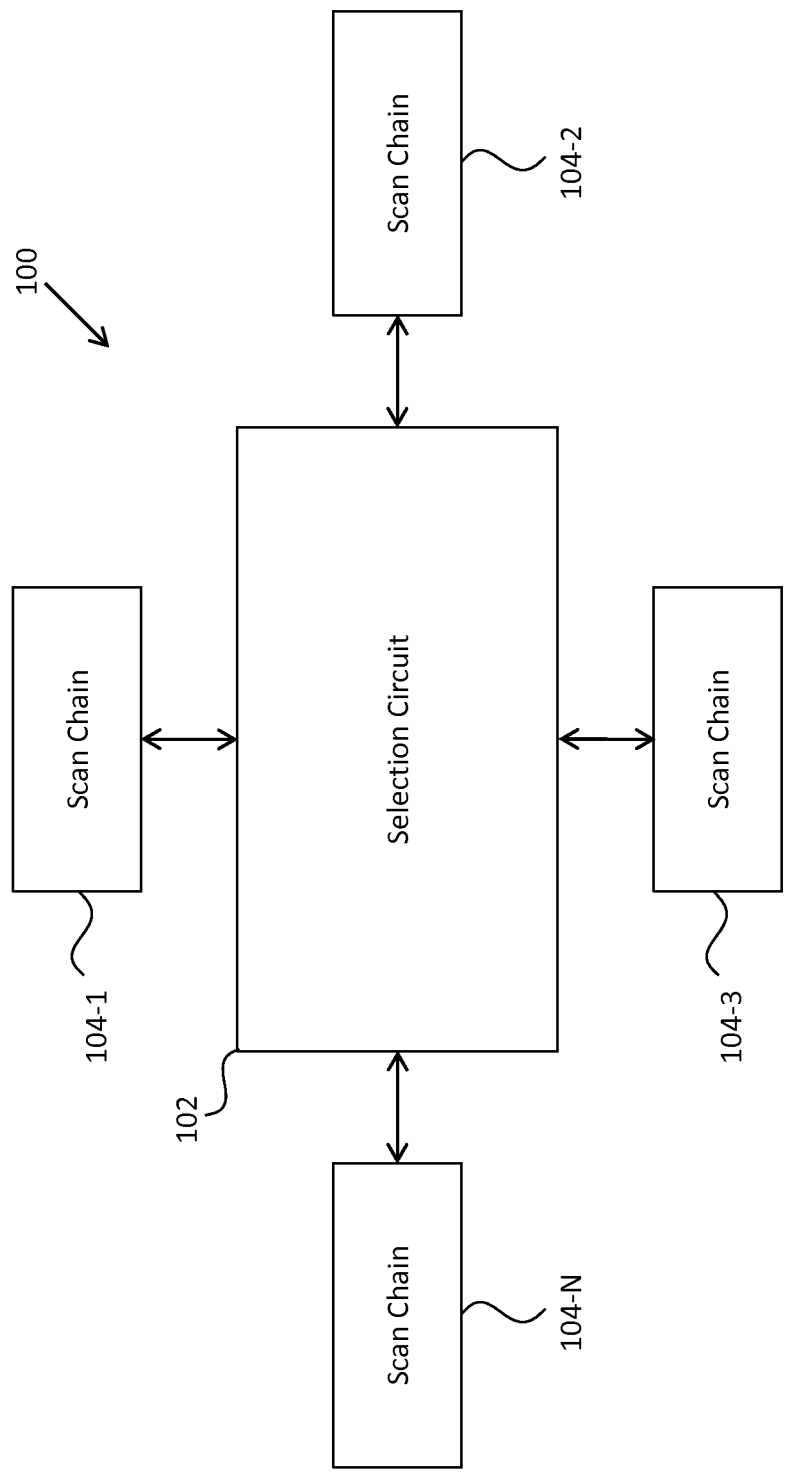
FIG. 1 is a block diagram of one example of a star-network topology of a plurality of scan chains.
Figure 2:
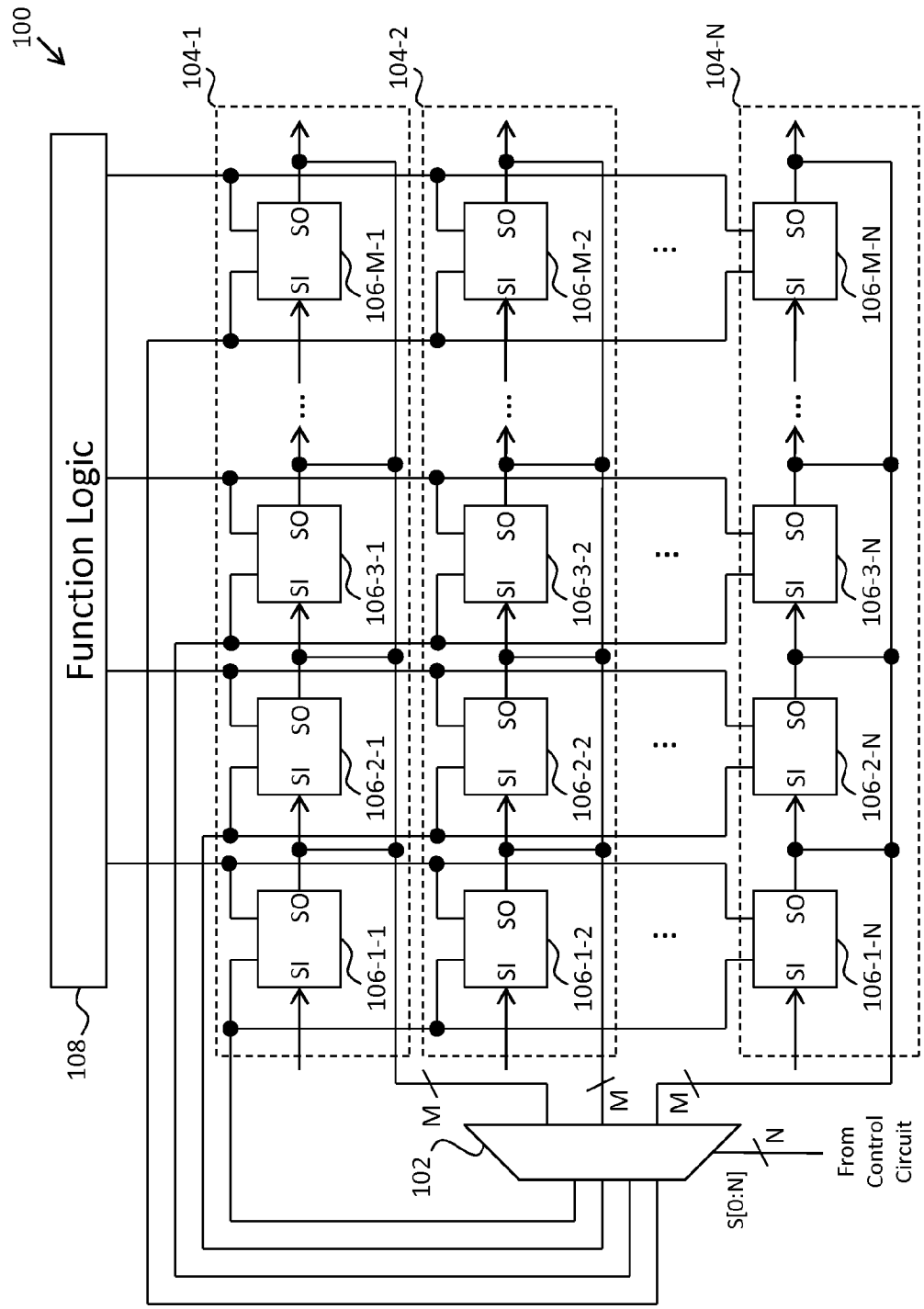
FIG. 2 is a detailed block diagram of one example of a direct access scan chain architecture in accordance with the star network topology illustrated in FIG. 1.

FIG. 1 is a block diagram of one example of a star-network topology 100 for a scan chain architecture in which a number, N, of scan chains 104-1, 104-2, 104-N (collectively referred to as "scan chains 104") are coupled to a selection circuit 102. As shown in FIG. 2, selection circuit 102 may be a multiplexer 102 configured to receive a plurality of selection signals S[0:N] for selecting one of the plurality of scan chains 104.

Each scan chain 104 includes a plurality of scan blocks 106-1, 106-2, 106-M (collectively referred to as "scan blocks 106") coupled to each other in series. For example, scan chain 104-1 includes a first scan block 106-1-1 having a scan input ("SI") configured to receive a scan input signal and a scan output ("SO") for outputting a time-delayed scan output signal. The SO terminal is coupled to the SI terminal of a second scan block 106-2-1. Scan block 106-2-1 has its SO terminal coupled to the SI terminal of scan block 106-3-1, which has its SO terminal coupled to the SI terminal of the next scan block in the series of scan blocks 106, and so on.

The SO terminals of each of the plurality of scan blocks 106 are coupled the respective inputs of multiplexer 102. Multiplexer 102 has M outputs such that each output is coupled to a respective scan block 106 in at least one of the scan chains 104. Each scan block 106 in each of the scan chains 104 also receives a signal from function logic 108. As will be understood by one skilled in the art, function logic 108 provides the normal functional data to different scan blocks in accordance with the application.

FIGS. 3A and 3B illustrate examples of scan blocks 106 in accordance with the scan chain architecture illustrated in FIGS. 1 and 2. Referring first to FIG. 3A, scan block 106 includes a scannable storage element 110, which may be based on a D flip-flop, a JK flip-flop, an SR flip-flop, a T flip-flop, or other storage element (FIG. 3C). Storage element 110 receives the functional data signal at the D input, while the SI input provides the test/scan data signal. The signal SE determines which of the two inputs (D or SI) is captured in storage element and output to Q. In one example embodiment as shown in FIG. 3A, the D input of storage element 110 receives a signal that is output from multiplexer or switch 112. Multiplexer 112 receives a first input from function logic 108 and a second input from the output of multiplexer 102 as illustrated in FIG. 2. A "Debug" signal is provided to multiplexer 112 for selectively coupling one of the first or second inputs of multiplexer 112 to the D input of storage element 110. As described below with respect to FIG. 3C, a scan enable ("SE") signal is provided to storage element 110 for selecting if storage element 110 receives the signal at the SI input or the signal at the D input.

Another embodiment of the scan block 106 is shown in FIG. 3B. In this example, the D input receives a signal directly from the functional logic 108, while the SI input receives a signal from the output of the multiplexer 112, which receives a signal from multiplexer 112 at a first input and scan data at a second input. A "Debug" signal is provided to multiplexer 112 for selecting which signal is supplied to the SI port of storage element 110, and a scan enable signal is provided to storage element 110 for selecting if storage element 110 receives the signal at the SI input or the signal at the D input.

FIG. 3C illustrates one example architecture of a scannable storage element 110. As shown in FIG. 3C, storage element 110 includes a flip-flop 114 having an input configured to receive the output of multiplexer 116. Multiplexer 116 has a "D" input and a signal input (SI), which are selectively coupled to the input of flip-flop 114 based on the scan enable ("SE") signal.

Figure 4A:
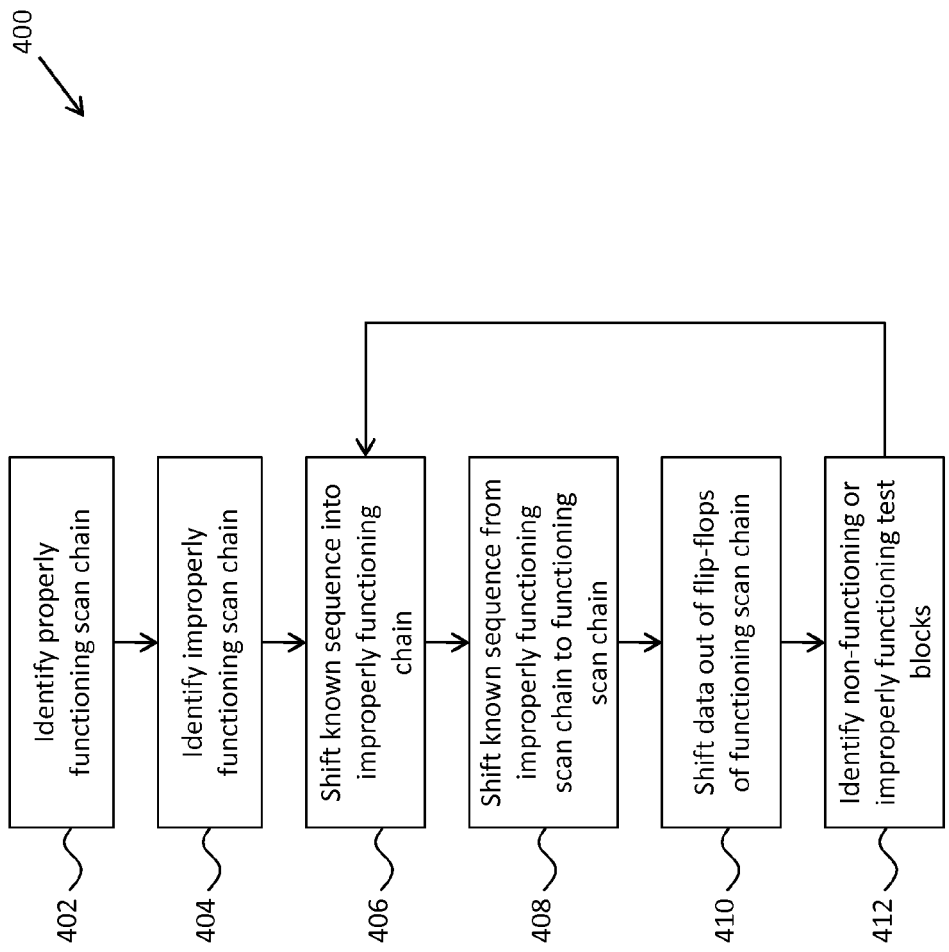
FIGS. 4A and 4B are flow diagrams of examples of methods of identifying an improperly functioning scan block in accordance with the direct access scan block architecture illustrated in FIG. 2.

The operation of the star-network topology that enables direct access from one scan chain to another scan chain is described with reference to FIGS. 2, 3A, and 4A, in which FIG. 4A is a flow chart of one example of a method 400 of identifying a scan chain defect. At block 402, a functioning scan chain, e.g., scan chain 104-2, is identified. A functioning scan chain may be identified by shifting a known logic sequence into each scan block 106 of a scan chain 104 and shifting a logic sequence out of the scan chain 104 to determine if the scan chain properly functions. For example, a known logic sequence of '0101010' may be fed into the scan input (SI) of flip-flop 110 in the first scan block 106-1 of a scan chain 104 and then cycled through each of the scan blocks 106 in the scan chain 104. The multiplexer 112 in each of the scan blocks 106 of the scan chain in which the known test sequence is being shifted couples the function logic 108 to flip-flop 110 during this process, and the signal SE is kept such that data present at the SI input is applied to flip-flop 110. As will be understood by one skilled in the art, the data may be read out by manually testing the voltage transitions at each of the nodes disposed between adjacent scan blocks 106 or by shifting the data sequence through the entire scan chain and electronically reading out the data using a testing apparatus. Once the data is electronically read out of the last scan block 106-M in the scan chain 104, a user/tester may review the data presented to the user/tester on a display of a computer. If the logic read out of the scan chain 104 matches the logic shifted into the scan chain 104, e.g., '0101010', then the scan chain 104 is a properly functioning scan chain.

A non-functioning or improperly functioning scan chain 104 is identified at block 404. A non-functioning or improperly functioning scan chain, e.g., scan chain 104-1, may be identified by switching a known logic sequence into a scan chain 104 and reading out the logic to determine if the scan chain 104 properly functions. As described above, the data may be read out by manually testing the voltage transitions at each of the nodes or by electronically reading out the data using a testing apparatus and reviewing the data on a computer. If the logic read out of the scan chain 104 does not match the logic sequence shifted into to the scan chain 104, then the scan chain is either improperly functioning or is non-functioning.

At block 406, a known logic sequence, e.g., '10101010', is shifted into the improperly functioning scan chain 104. The known logic sequence is shifted into the improperly functioning scan chain 104-1 is the same manner as the test sequence is shifted into a scan chain as described above.

The known logic sequence is output from the improperly functioning scan chain 104-1 into the functioning scan chain 104-2 at block 408. The logic sequence is output from the improperly functioning scan chain 104-1 into the functioning scan chain 104-1 by providing control signals to multiplexer 102 such that multiplexer 102 directly routes the output of each scan block 106 in the improperly functioning scan chain (i.e., scan blocks 106-1-1 to 106-M-1) to the inputs of each of the respective scan blocks 106 in the properly functioning scan chain (i.e., scan blocks 106-1-2 to 106-M-2). Additionally, multiplexers 112 of the scan blocks 106 in the functioning scan chain 104-2 are configured such that they couple the outputs of multiplexer 102 (i.e., the outputs of flip-flops 112 in the non-functioning scan chain 104-2) to an input of the flip-flop 110 in the functioning scan chain 104-2. Each scan block 106 in the properly functioning scan chain receives a respective bit of the logic sequence output by the improperly functioning scan chain directly from a respective output of a scan block. In this manner, data is directly transferred from each of the storage elements 110 in the non-functioning scan chain 104-1 into the corresponding storage elements 110 in the functioning scan chain 104-2.

At block 410, the data in the functioning scan chain 104-2 is shifted out of the storage elements 110 so that it can be analyzed. As described above, the data may be read out by manually testing the voltage at each of the nodes disposed between adjacent logic blocks 106 or by electronically reading out the data using a testing apparatus and reviewing the data on a computer.

The non-functioning or improperly functioning scan blocks are identified at block 412. The non-functioning or improperly functioning scan block are identified by comparing the data that was shifted into the improperly functioning scan chain 104-1, which was then output into and read out from the functioning scan chain 104-2, to the known logic sequence that was originally shifted into the improperly functioning scan chain 104-1. An improperly functioning or non-functioning scan block 106 is identified when the data read out of the properly functioning scan chain that was received from the improperly functioning scan chain does not match the data shifted into the improperly functioning scan chain. For example, if the known logic string shifted into the improperly functioning scan chain 104-1 was '10101010' and the data read out was '10101111', then the improperly functioning scan blocks 106 are the sixth and eighth scan blocks (i.e., scan blocks 106-6-1 and 106-8-1) since the sixth and eighth bits (i.e., the bits associated with the sixth and eighth data blocks) of the two logical sequences are mismatched.

The improperly or non-functioning scan block(s) 106 may then be analyzed to determine the cause of the improper functioning. As shown in FIG. 4A, method 400 may repeat blocks 406-412 for each of the scan chains 104 that are identified as improperly functioning. The direct access scan chain circuit 100 and method of identifying a scan chain and scan block defect described advantageously enable a full diagnosis of a scan chain regardless of the defect type and defect location. For example, non-functioning scan blocks or scan blocks that rise too quickly or too slowly may be identified. Additionally, the direct access scan chain topology enables full testing of each of the components, including the multiplexers, without having a dependence on the functioning of other scan chains.

Figure 4B:
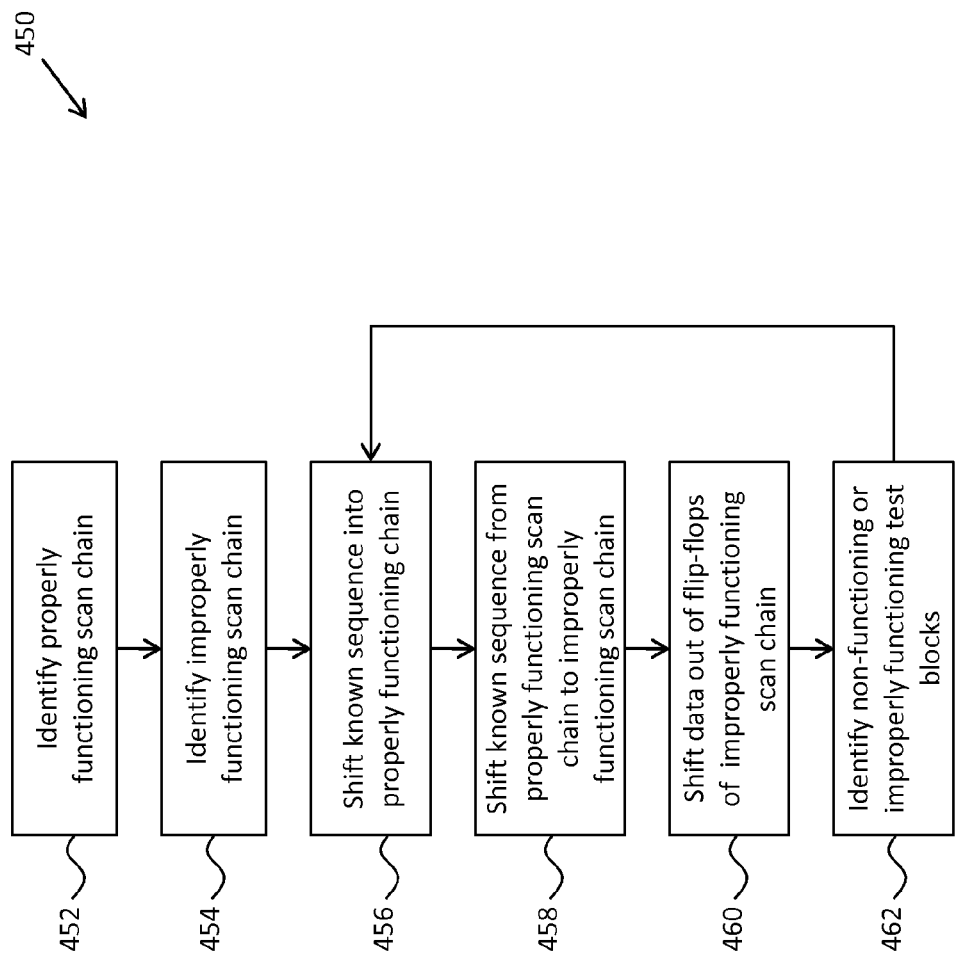

FIG. 4B is a flow chart of another example of a method 450 of identifying a scan chain defect in accordance with FIGS. 2 and 3A. As shown in FIG. 4B, a functioning scan chain, e.g., scan chain 104-2, is identified at block 452. A functioning scan chain may be identified by shifting a known logic sequence into each scan block 106 of a scan chain 104 and shifting a logic sequence out of the scan chain 104 to determine if the scan chain properly functions.

For example, a known logic sequence of '0101010' may be fed into the scan input (SI) of flip-flop 110 in the first scan block 106-1 of a scan chain 104 and then cycled through each of the scan blocks 106 in the scan chain 104. The multiplexer 112 in each of the scan blocks 106 of the scan chain in which the known test sequence is being shifted couples the function logic 108 to flip-flop 110 during this process, and the signal SE is kept such that data present at the SI input is applied to flip-flop 110. As will be understood by one skilled in the art, the data may be read out by manually testing the voltage transitions at each of the nodes disposed between adjacent scan blocks 106 or by shifting the data sequence through the entire scan chain and electronically reading out the data using a testing apparatus. Once the data is electronically read out of the last scan block 106-M in the scan chain 104, a user/tester may review the data presented to the user/tester on a display of a computer. If the logic read out of the scan chain 104 matches the logic shifted into the scan chain 104, e.g., '0101010', then the scan chain 104 is a properly functioning scan chain.

At block 454, a non-functioning or improperly functioning scan chain 104 is identified. A non-functioning or improperly functioning scan chain, e.g., scan chain 104-2, may be identified by switching a known logic sequence into a scan chain 104 and reading out the logic to determine if the scan chain 104 properly functions. As described above, the data may be read out by manually testing the voltage transitions at each of the nodes or by electronically reading out the data using a testing apparatus and reviewing the data on a computer. If the logic read out of the scan chain 104 does not match the logic sequence shifted into to the scan chain 104, then the scan chain is either improperly functioning or is non-functioning.

At block 456, a known logic sequence, e.g., '10101010', is shifted into the properly functioning scan chain 104. The known logic sequence is shifted into the properly functioning scan chain 104-1 is the same manner as the test sequence is shifted into a scan chain as described above.

The known logic sequence is output from the properly functioning scan chain 104-1 into the improperly functioning scan chain 104-2 at block 458. The logic sequence is output from the properly functioning scan chain 104-1 into the improperly functioning scan chain 104-1 by providing control signals to multiplexer 102 such that multiplexer 102 directly routes the output of each scan block 106 in the properly functioning scan chain (i.e., scan blocks 106-1-1 to 106-M-1) to the inputs of each of the respective scan blocks 106 in the improperly functioning scan chain (i.e., scan blocks 106-1-2 to 106-M-2). Additionally, multiplexers 112 of the scan blocks 106 in the improperly functioning scan chain 104-2 are configured such that they couple the outputs of multiplexer 102 (i.e., the outputs of flip-flops 112 in the functioning scan chain 104-2) to an input of the flip-flop 112 in the improperly functioning scan chain 104-2. Each scan block 106 in the improperly functioning scan chain receives a respective bit of the logic sequence output by the properly functioning scan chain directly from a respective output of a scan block. In this manner, data is directly transferred from each of the storage elements 110 in the functioning scan chain 104-1 into the corresponding storage elements 110 in the improperly functioning scan chain 104-2.

At block 460, the data in the improperly functioning scan chain 104-2 is shifted out of the storage elements 110 so that it can be analyzed. As described above, the data may be read out by manually testing the voltage at each of the nodes disposed between adjacent logic blocks 106 or by electronically reading out the data using a testing apparatus and reviewing the data on a computer.

The non-functioning or improperly functioning scan blocks are identified at block 462. The non-functioning or improperly functioning scan block are identified by comparing the data that was shifted into the properly functioning scan chain 104-1, which was then output into and read out from the improperly functioning scan chain 104-2, to the known logic sequence that was originally shifted into the properly functioning scan chain 104-1. An improperly functioning or non-functioning scan block 106 is identified when the data read out of the improperly functioning scan chain that was received from the properly functioning scan chain does not match the data shifted into the properly functioning scan chain. For example, if the known logic string shifted into the properly functioning scan chain 104-1 was '10101010' and the data read out of the improperly functioning scan chain 104-2 was '10101111', then the improperly functioning scan blocks 106 are the sixth and eighth scan blocks (i.e., scan blocks 106-6-1 and 106-8-1) since the sixth and eighth bits (i.e., the bits associated with the sixth and eighth data blocks) of the two logical sequences are mismatched.

The improperly or non-functioning scan block(s) 106 may then be analyzed to determine the cause of the improper functioning. As shown in FIG. 4B, method 450 may repeat blocks 456-462 for each of the scan chains 104 that are identified as improperly functioning. The direct access scan chain circuit 100 and method of identifying a scan chain and scan block defect described advantageously enable a full diagnosis of a scan chain regardless of the defect type and defect location. For example, non-functioning scan blocks or scan blocks that rise too quickly or too slowly may be identified. Additionally, the direct access scan chain topology enables full testing of each of the components, including the multiplexers, without having a dependence on the functioning of other scan chains.

Figure 5:
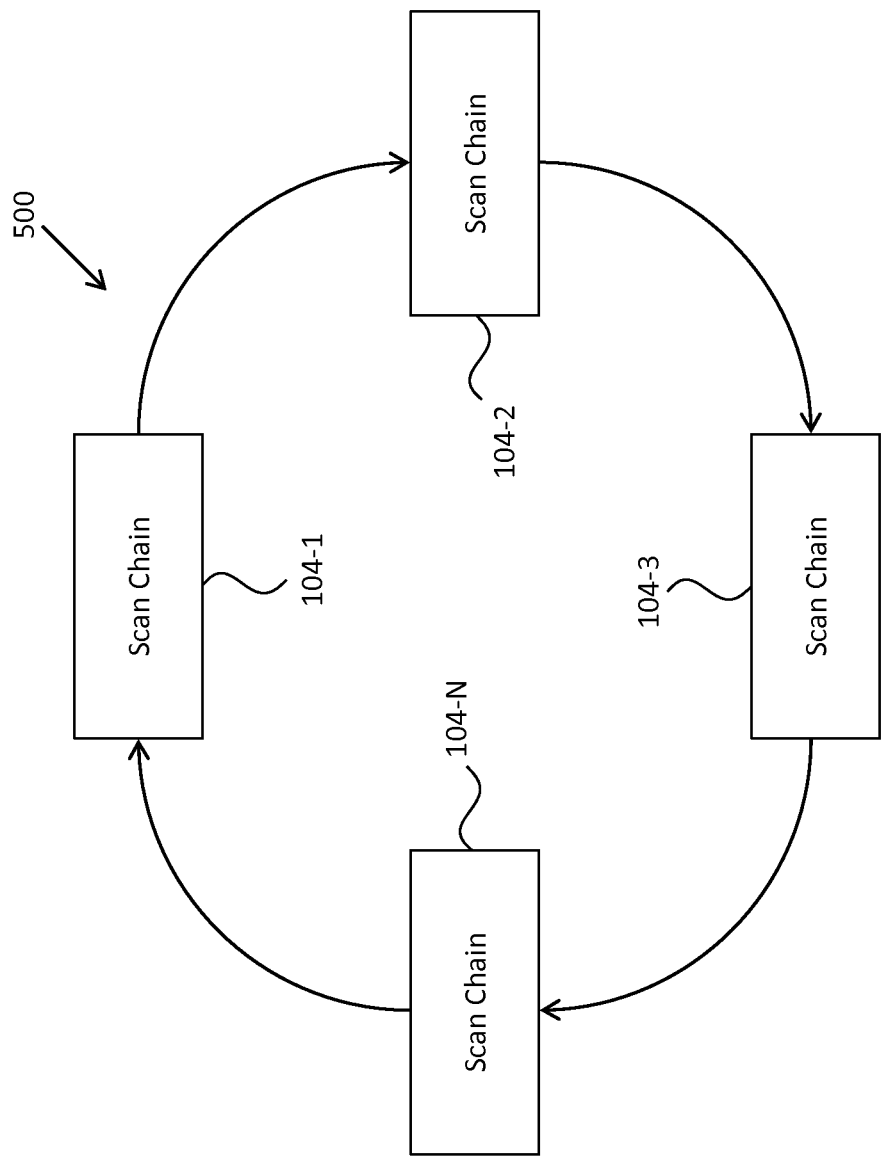
FIG. 5 is a block diagram of one example of a ring network topology of a plurality of scan chains.
Figure 6:
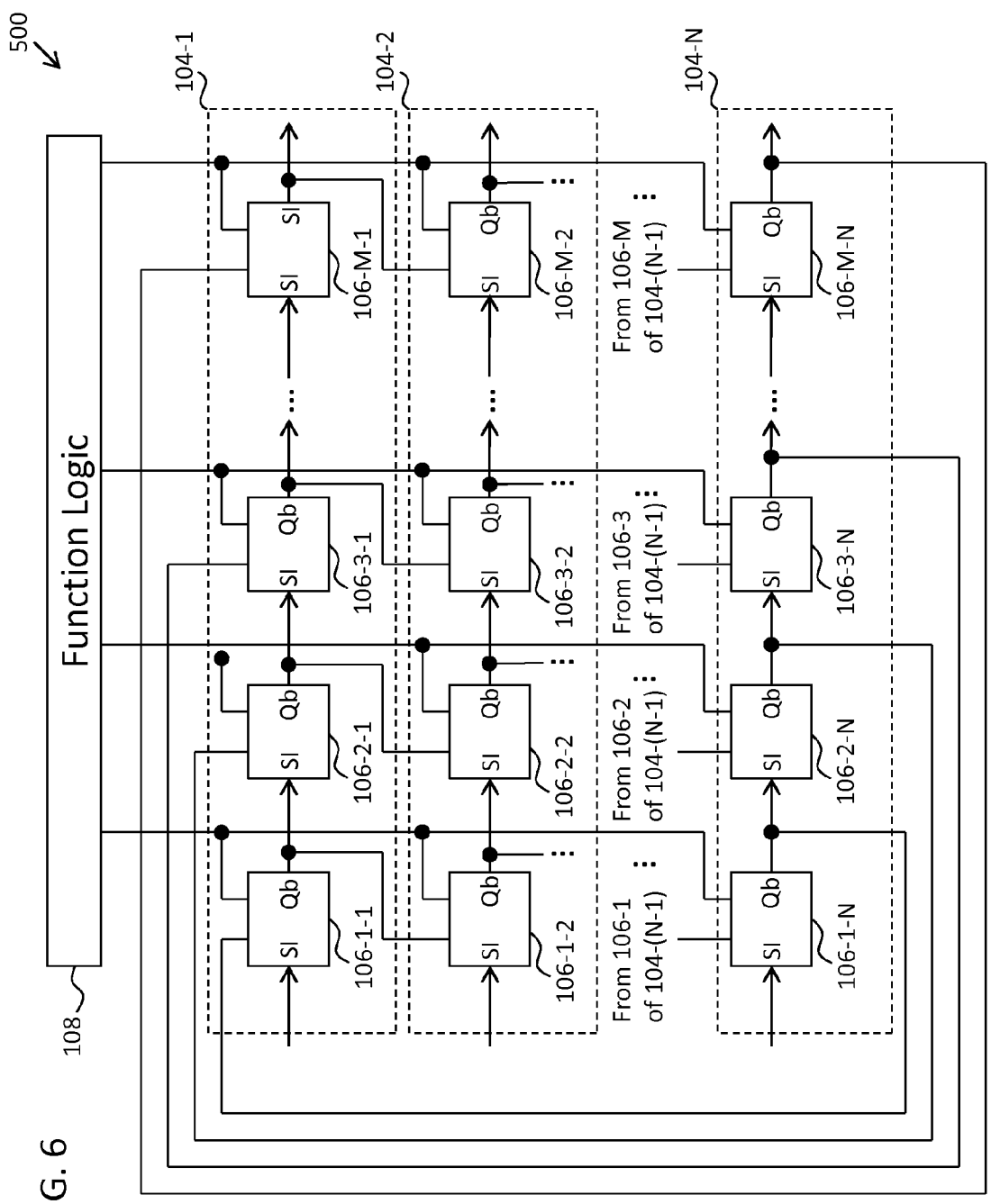
FIG. 6 is a detailed block diagram of one example of a sequential access scan chain architecture in accordance with the ring network topology illustrated in FIG. 5.

FIG. 5 is a block diagram of one example of a ring or sequential access network topology 500 for a number, N, of scan chains 104. As shown in FIG. 6, the sequential access topology 500 does not include a multiplexer 102 like the direct access topology 100 described above and illustrated in FIGS. 1 and 2. Instead, the output of each of the M scan blocks 106 in a scan chain 104 is coupled to an input of a corresponding scan block in another scan chain 104. For example, the output of scan block 106-1-1 in scan chain 104-1 is coupled to an input of scan block 106-1-2 in scan chain 104-2 as illustrated in FIG. 6. Similarly, the output of scan block 106-2-1 in scan chain 104-1 is coupled to an input of scan block 106-2-2 of scan chain 104-2. In this manner, sequential access between each of the scan chains 104 of the sequential access network 500 is provided.

Figure 7A:
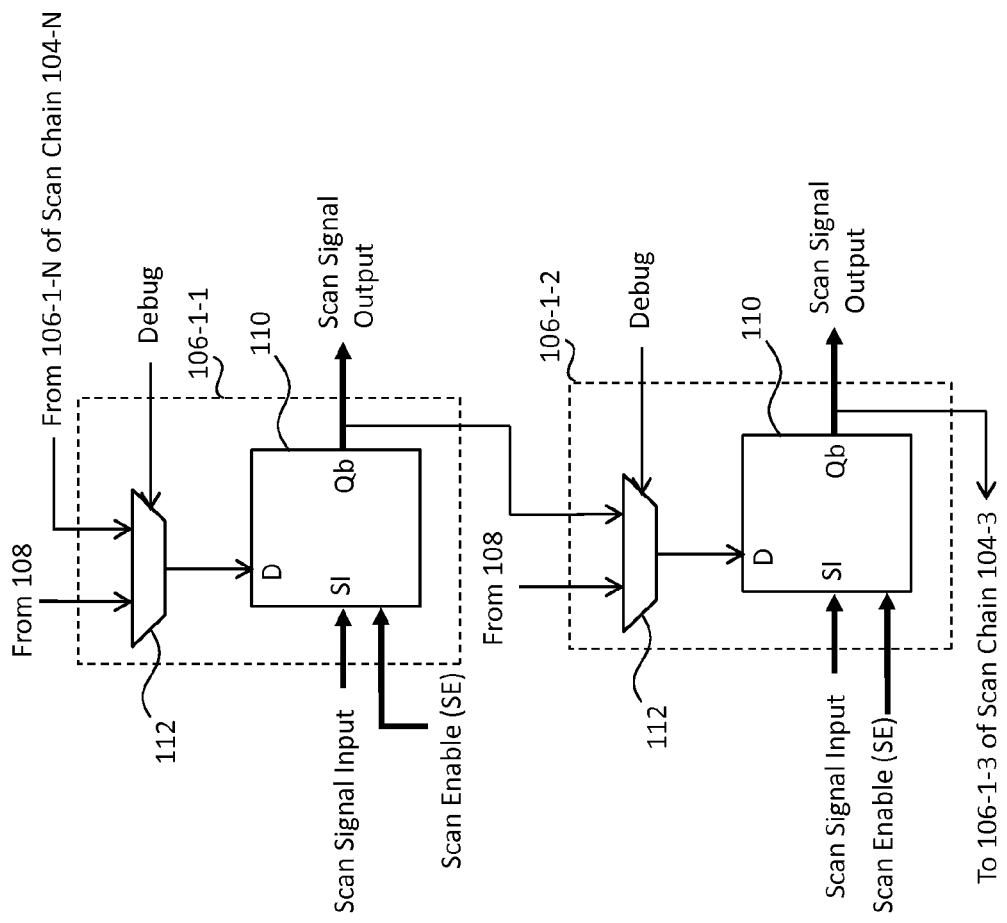
FIGS. 7A and 7B illustrate examples of scan blocks in accordance with FIGS. 5 and 6.
Figure 7B:
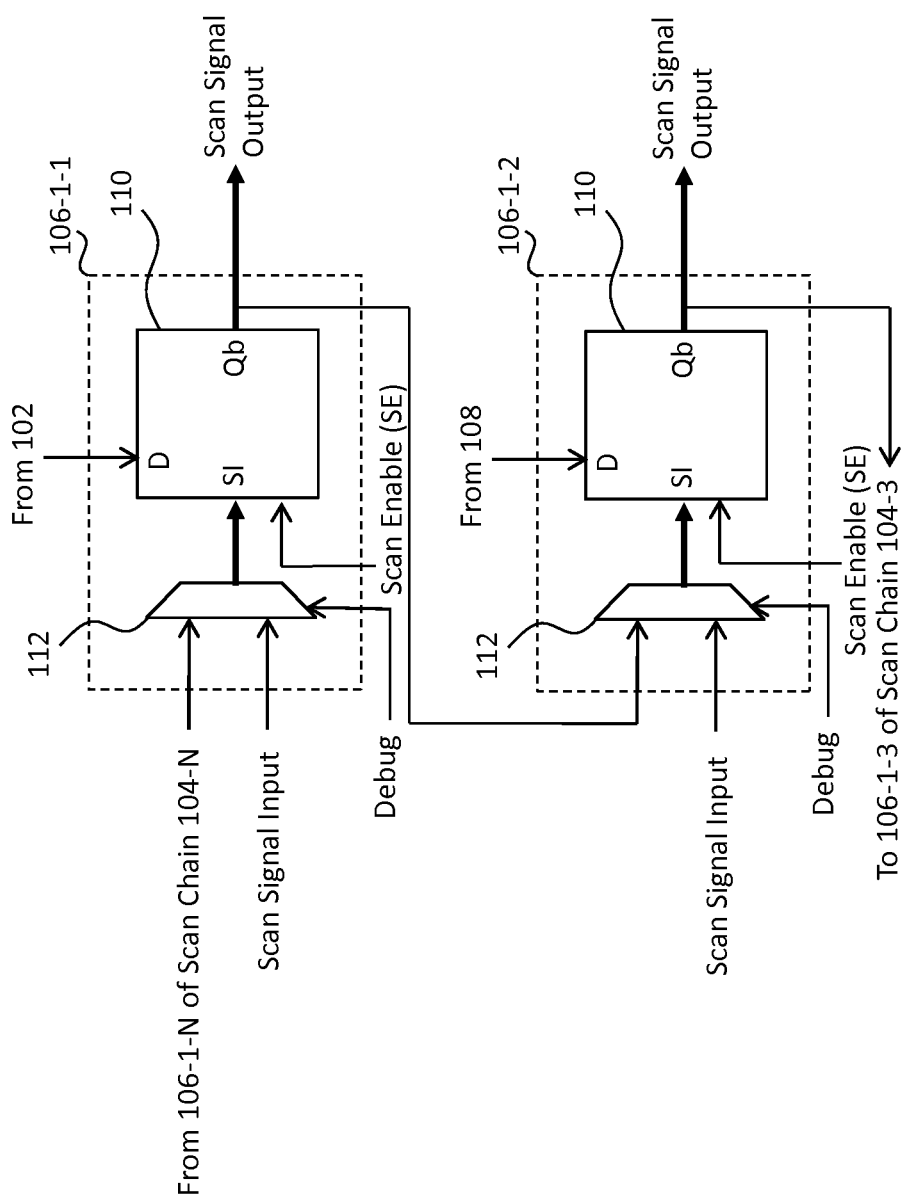

FIGS. 7A and 7B illustrate examples of scan blocks 106 disposed in adjacent scan chains 104 in accordance with the scan chain architecture illustrated in FIGS. 5 and 6. Referring first to FIG. 7A, each scan block 106 includes a scannable storage element 110 having a signal input configured to receive a logic signal and an output terminal, Q, configured to output the logic signal after a delay. Storage element 110 may be a D flip-flop, a JK flip-flop, an SR flip-flop, a T flip-flop, or other storage element as will be understood by one skilled in the art.

A switching device 112, such as a multiplexer or a switch, receives a signal from function logic circuit 108 and the output signal from a scan block 106 in another scan chain. For example, if scan block 106-1-1 is the first test block in scan chain 104-1, then multiplexer 112 of scan block 106-1-1 may receive the output of storage element 110 in scan chain 104-N. The output of storage element 110 is routed to an input of multiplexer 112 in scan chain 104-2. One skilled in the art will understand that adjacent scan chains (e.g., scan chains 104-1, 104-2) may be connected to each other or that they may be connected to other scan chains 104. For example, scan chain 104-1 may be connected to scan chain 104-3. A "Debug" signal is provided to multiplexer 112 for selectively coupling one of the first or second inputs of multiplexer 112 to the D input of storage element 110, and a scan enable signal is provided to storage element 110 for selecting if storage element 110 receives the signal at the SI input or the signal at the D input.

Each of the scan blocks 106 illustrated in FIG. 7B also includes a storage element 110 and a multiplexer 112. Storage element 110 receives a data signal directly from function logic circuit 108 at the D input. Multiplexer 112 has its output connected to the SI terminal of storage element 110 and receives a logic signal at one input and the output of a corresponding storage element 110 from another scan chain 104 at a second input. A "Debug" signal is provided to multiplexer 112 for selecting which signal is supplied to the SI port of storage element 110, and a scan enable signal is provided to storage element 110 for selecting if storage element 110 receives the signal at the SI input or the signal at the D input. Multiplexer 112 of scan chain 104-1 may receive a scan signal input at one input and the output of scan block 106-1-N of scan chain 104-N at a second input, and the output of scan chain 104-1 may be routed to an input of multiplexer 112 of scan block 106-1-2 of scan chain 104-2. In this manner, each scan block 106 in a scan chain 104 is connected to a respective scan block 106 in a sequential scan chain 104.

Figure 8A:
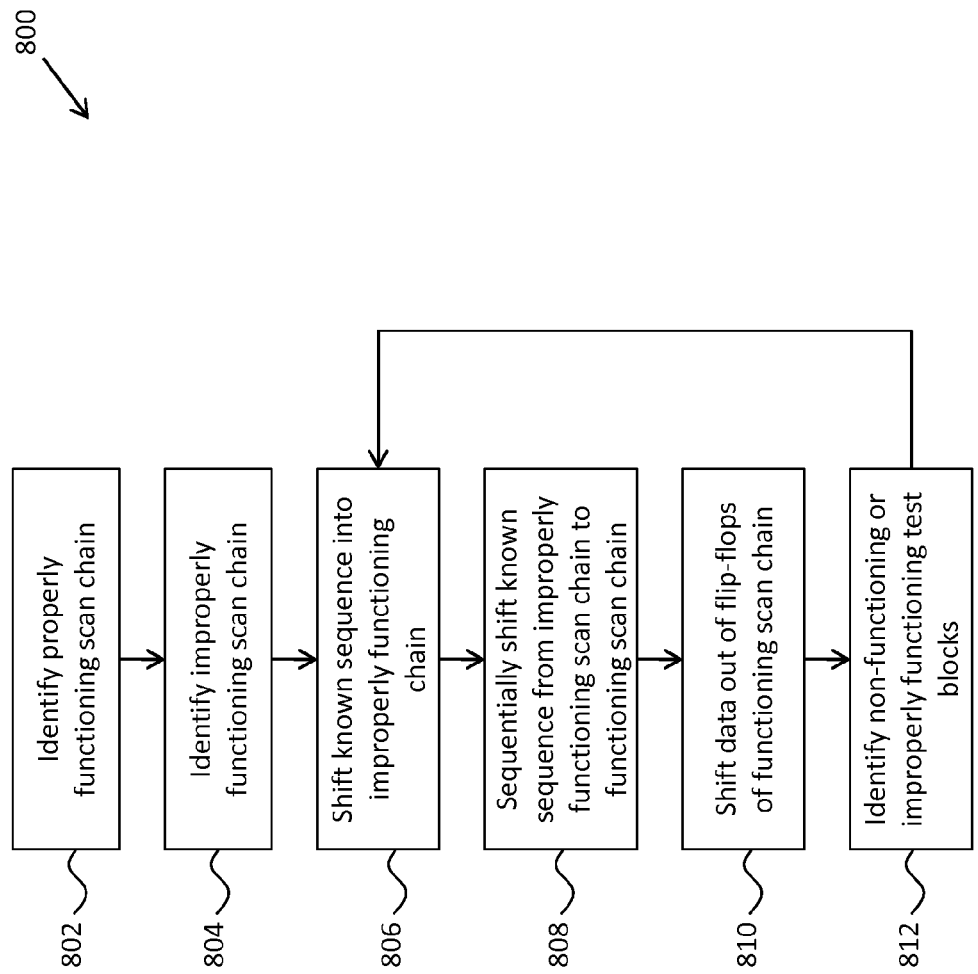

The operation of the ring-network topology that enables sequential access from one scan chain to another scan chain is described with reference to FIGS. 6, 7A, and 8A, in which FIG. 8A is a flow chart of one example of a method 800 of identifying a scan chain defect. At block 802, a functioning scan chain, e.g., scan chain 104-N, is identified. A functioning scan chain may be identified by shifting a known logic sequence into a scan chain 104 and reading out the logic sequence to determine if the scan chain properly functions. For example, a known logic sequence of '0101010' may be fed into the scan input of flip-flop 110 in the first scan block 106-1 of a scan chain 104 and then cycled through each of the scan blocks 106 in the scan chain 104. The multiplexer 112 in each of the scan blocks 106 of the scan chain in which the known test sequence is being read into couples the function logic 108 to storage element 110 during this process, and the signal SE is such that data present at the SI input is applied to storage element 110. As will be understood by one skilled in the art, the bits of data may be read out by manually testing the voltage at each of the nodes disposed between adjacent scan blocks 106 or by electronically reading out the data of a scan chain 104 using a testing apparatus and reviewing the data on a computer. If the logical sequence read out of the scan chain 104 matches the logic sequence shifted into the scan chain 104, e.g., '0101010', then the scan chain 104 is a properly functioning scan chain.

A non-functioning or improperly functioning scan chain 104 is identified at block 804. A non-functioning or improperly functioning scan chain, e.g., scan chain 104-1, may be identified by shifting in a known logic into a scan chain 104 and reading out the logic to determine if the scan chain properly functions. As described above, the data may be read out by manually testing the voltage transitions at each of the nodes between adjacent scan blocks 106 or by electronically reading out the data out of a scan chain by using a testing apparatus and reviewing the data on a computer. If the logic sequence read out of the scan chain 104 does not match the logic sequence shifted into the scan chain 104, then the scan chain either improperly function or is non-functioning.

At block 806, a known logic sequence, e.g., '10101010', is shifted into the improperly functioning scan chain, e.g., scan chain 104-1. The manner in which the known logic sequence is shifted into the improperly functioning scan chain 104-N is the same manner as the test sequence is shifted into a scan chain 104 as described above.

The known logic sequence is shifted from the improperly functioning scan chain 104-1 into the functioning scan chain 104-N at block 408. The logic sequence is output from the improperly functioning scan chain 104-1 to the functioning scan chain 104-N by switching multiplexers 112 in each of the scan blocks 106 such that they couple the output of an adjacent scan chain 104 to the input of the storage element 110. For example, multiplexer 112 of scan block 106-1-2 in scan chain 104-2 connects the input of flip-flop 110 to the output of scan block 106-1-2 in scan chain 104-2, and multiplexer 112 of scan block 106-1-3 in scan chain 104-3 connects the input of storage element 110 to the output of scan block 106-1-2 in scan chain 104-2. In this manner, data is sequentially transferred from each of the storage elements 110 in the non-functioning scan chain 104-1 into the corresponding storage elements 110 in a functioning scan chain 104-N. Accordingly, if scan chain 104-1 is not properly functioning and scan chain 104-4 is properly functioning, then data is output from flip-flops 110 of scan chain 104-1 into storage elements 110 of scan chain 104-2, then output from flip-flops 110 of scan chain 104-2 into the storage elements 110 of scan chain 104-3, and then output from the storage elements 110 of scan chain 104-3 into the storage elements 110 of scan chain 104-4.

At block 810, the data in the functioning scan chain is shifted out of the flip-flops 110 such that it can be analyzed. As described above, the data may be read out by manually testing the voltage at each of the nodes between scan blocks 106 or by electronically reading out the data using a testing apparatus and reviewing the data on a computer.

The non-functioning or improperly functioning scan blocks are identified at block 412. The non-functioning or improperly functioning scan block are identified by comparing the data that was shifted into the improperly functioning scan chain, which was then output into and read out from the functioning scan chain, to the known logic sequence that was originally shifted into the improperly functioning scan chain. An improperly functioning or non-functioning scan block 106 is identified when the data read out does not match the data read in. For example, if the known logic sequence shifted into the improperly functioning scan chain was '10101010' and the data read out of the functioning scan chain after being output from the non-functioning scan chain was '10101111', then the improperly functioning data blocks are the sixth and eighth data blocks since the sixth and eighth bits, which correspond or are otherwise associated with the sixth and eighth scan blocks of a scan chain, are ones instead of zeroes.

The improperly or non-functioning scan block 106 may then be analyzed to determine the cause of the improper functioning. As shown in FIG. 8, method 800 may repeat blocks 806-812 for each of the scan chains 104 that are identified as improperly functioning. The sequential access scan chain circuit 500 and method of identifying a scan chain and scan block defect described advantageously enable a full diagnosis of a scan chain regardless of the defect type and defect location. For example non-functioning scan blocks or scan blocks that rise too quickly or too slowly may be identified. Additionally, the sequential access scan chain topology 500 enables full testing of each of the components, including the multiplexers, without having a dependence on the functioning of other scan chains.

FIG. 8B is a flow chart of another example of a method 850 of identifying a scan chain defect. A functioning scan chain, e.g., scan chain 104-N, is identified at block 852. A functioning scan chain may be identified by shifting a known logic sequence into a scan chain 104 and reading out the logic sequence to determine if the scan chain properly functions. For example, a known logic sequence of '0101010' may be fed into the scan input of flip-flop 110 in the first scan block 106-1 of a scan chain 104 and then cycled through each of the scan blocks 106 in the scan chain 104. The multiplexer 112 in each of the scan blocks 106 of the scan chain in which the known test sequence is being read into couples the function logic 108 to storage element 110 during this process, and the signal SE is such that data present at the SI input is applied to storage element 110. As will be understood by one skilled in the art, the bits of data may be read out by manually testing the voltage at each of the nodes disposed between adjacent scan blocks 106 or by electronically reading out the data of a scan chain 104 using a testing apparatus and reviewing the data on a computer. If the logical sequence read out of the scan chain 104 matches the logic sequence shifted into the scan chain 104, e.g., '0101010', then the scan chain 104 is a properly functioning scan chain.

At block 854, a non-functioning or improperly functioning scan chain 104 is identified. A non-functioning or improperly functioning scan chain, e.g., scan chain 104-1, may be identified by shifting in a known logic into a scan chain 104 and reading out the logic to determine if the scan chain properly functions. As described above, the data may be read out by manually testing the voltage transitions at each of the nodes between adjacent scan blocks 106 or by electronically reading out the data out of a scan chain by using a testing apparatus and reviewing the data on a computer. If the logic sequence read out of the scan chain 104 does not match the logic sequence shifted into the scan chain 104, then the scan chain either improperly function or is non-functioning.

A known logic sequence, e.g., '10101010', is shifted into the properly functioning scan chain, e.g., scan chain 104-N, at block 856. The manner in which the known logic sequence is shifted into the properly functioning scan chain 104-N is the same manner as the test sequence is shifted into a scan chain 104 as described above.

The known logic sequence is shifted from the properly functioning scan chain 104-N into the improperly functioning scan chain 104-1 at block 458. The logic sequence is output from the properly functioning scan chain 104-N to the improperly functioning scan chain 104-1 by switching multiplexers 112 in each of the scan blocks 106 such that they couple the output of an adjacent scan chain 104 to the input of the storage element 110. For example, multiplexer 112 of scan block 106-1-N in scan chain 104-N connects the input of flip-flop 110 to the output of scan block 106-1-N in scan chain 104-N. In this manner, data is sequentially transferred from each of the storage elements 110 in the functioning scan chain 104-N into the corresponding storage elements 110 in an improperly functioning scan chain 104-1. Accordingly, if scan chain 104-4 is improperly functioning and scan chain 104-1 is properly functioning, then data is output from flip-flops 110 of scan chain 104-1 into storage elements 110 of scan chain 104-2, then output from flip-flops 110 of scan chain 104-2 into the storage elements 110 of scan chain 104-3, and then output from the storage elements 110 of scan chain 104-3 into the storage elements 110 of scan chain 104-4.

At block 860, the data in the improperly functioning scan chain is shifted out of the flip-flops 110 such that it can be analyzed. As described above, the data may be read out by manually testing the voltage at each of the nodes between scan blocks 106 or by electronically reading out the data using a testing apparatus and reviewing the data on a computer.

The non-functioning or improperly functioning scan blocks are identified at block 462. The non-functioning or improperly functioning scan block are identified by comparing the data that was shifted into the properly functioning scan chain, which was then output into and read out from the improperly functioning scan chain, to the known logic sequence that was originally shifted into the properly functioning scan chain. An improperly functioning or non-functioning scan block 106 is identified when the data read out does not match the data read in. For example, if the known logic sequence shifted into the improperly functioning scan chain was '10101010' and the data read out of the functioning scan chain after being output from the non-functioning scan chain was '10101111', then the improperly functioning data blocks are the sixth and eighth data blocks since the sixth and eighth bits, which correspond or are otherwise associated with the sixth and eighth scan blocks of a scan chain, are ones instead of zeroes.

The improperly or non-functioning scan block 106 may then be analyzed to determine the cause of the improper functioning. As shown in FIG. 8B, method 850 may repeat blocks 856-862 for each of the scan chains 104 that are identified as improperly functioning. The sequential access scan chain circuit 500 and method of identifying a scan chain and scan block defect described advantageously enable a full diagnosis of a scan chain regardless of the defect type and defect location. For example non-functioning scan blocks or scan blocks that rise too quickly or too slowly may be identified. Additionally, the sequential access scan chain topology 500 enables full testing of each of the components, including the multiplexers, without having a dependence on the functioning of other scan chains.

In some embodiments, a method includes shifting a first logic sequence into a first scan chain having a first plurality of scan blocks coupled together, outputting a second logic sequence from each of the plurality of scan blocks in the first scan chain to a respective scan block in a second scan chain, and shifting a third logic sequence out of the second scan chain. At least one improperly functioning scan block of the first scan chain is identified based on the third logic sequence shifted out of the second scan chain.

In some embodiments, a circuit includes a plurality of scan chains each including a plurality of scan blocks. Each scan block includes a storage element and a switching device having an output directly coupled to an input of the storage element. The switching device has a first input configured to receive an output of a storage element in a different scan chain from the scan chain in which the switching device is disposed and a second input configured to receive one of a function logic output signal or a scan input signal. The switching device is configured to selectively couple the first input or the second input to the input of the storage element.

In some embodiments, a method includes a) shifting a first logic sequence into a plurality of scan blocks in a first improperly functioning scan chain, b) outputting a second logic sequence from the scan blocks of the first improperly functioning scan chain to a plurality of scan blocks of a second properly functioning scan chain, the second logic sequence being different from the first scan logic sequence due to at least one improperly functioning scan block in the first improperly functioning scan chain, c) shifting the second logic sequence out of the second properly functioning scan chain, and d) identifying the at least one improperly functioning scan block in the first improperly functioning scan chain based on a comparison of the second logic sequence to the first logic sequence. Steps a) through d) are repeated for each improperly functioning scan chain.

Although the circuits and methods have been described in terms of exemplary embodiments, they are not limited thereto. Rather, the appended claims should be construed broadly, to include other variants and embodiments of the circuits and methods, which may be made by those skilled in the art without departing from the scope and range of equivalents of the circuits and methods. Delimiters used in the claims—such as 'a)' and 'i)'—should not be taken as imputing any order to the claims, but rather are provided only to serve as visual cues to add in the parsing of the claims and as identifiers in the event that a particular portion of the claim is to be later referenced.

What is claimed is:
1. A method, comprising:
 a) shifting a first logic sequence into a first scan chain having a first plurality of scan blocks coupled together;
 b) outputting a second logic sequence from each of the plurality of scan blocks in the first scan chain to a respective scan block in a second scan chain, the step including
  i) switching an input of a flip-flop in each of a third plurality of scan blocks in a third scan chain from being configured to receive a signal from function logic to being configured to receive a signal output from a respective scan block in the first scan chain,
ii) switching an input of a flip-flop in each scan block of the second scan chain from being configured to receive a signal from function logic to being configured to receive a signal output from a respective scan block in the third scan chain,
iii) receiving the signal output from the scan block in the third scan chain at the respective input of the flip-flop in the scan block of the second scan chain, and
iv) receiving the signal output from the scan block in the second scan chain at the respective input of the flip-flop in each scan block of the first scan chain;
c) shifting a third logic sequence out of the second scan chain; and
d) identifying at least one improperly functioning scan block of the first scan chain based on the third logic sequence shifted out of the second scan chain.

2. The method of claim 1, wherein
the first scan chain is an improperly functioning scan chain,
the second scan chain is a properly functioning scan chain,
the second logic sequence is different from the first logic sequence, and
the third logic sequence matches the second logic sequence.

3. The method of claim 1, wherein step d) includes:
i) comparing the first logic sequence to the third logic sequence,
ii) identifying at least one difference between the first logic sequence and the third logic sequence, and
iii) identifying, as the improperly functioning scan block, at least one scan block associated with the at least one difference between the first logic sequence and the third logic sequence.

4. The method of claim 1, further comprising:
e) shifting a fourth logic sequence into the second scan chain;
f) shifting a fifth logic sequence out of the second scan chain;
g) comparing the fifth logic sequence to the fourth logic sequence; and
h) identifying the first scan chain as a properly functioning scan chain if the fourth logic sequence matches the fifth logic sequence.

5. The method of claim 1, further comprising:
e) shifting a fourth logic sequence into the first scan chain;
f) shifting a fifth logic sequence out of the first scan chain;
g) comparing the fifth logic sequence to the fourth logic sequence; and
h) identifying the first scan chain as an improperly functioning scan chain if the fifth logic sequence does not matches the fourth logic sequence.

6. A method, comprising:
a) shifting a first logic sequence into a plurality of scan blocks in a first improperly functioning scan chain;
b) outputting a second logic sequence from the scan blocks of the first improperly functioning scan chain to a plurality of scan blocks of a second properly functioning scan chain, the second logic sequence being different from the first scan logic sequence due to at least one improperly functioning scan block in the first improperly functioning scan chain, the step including
i) switching an input of a flip-flop in each of a third plurality of scan blocks in a third scan chain from being configured to receive a signal from function logic to being configured to receive a signal output from a respective scan block in the first scan chain,
ii) switching an input of a flip-flop in each scan block of the second scan chain from being configured to receive a signal from function logic to being configured to receive a signal output from a respective scan block in the third scan chain,
iii) receiving the signal output from the scan block in the third scan chain at the respective input of the flip-flop in the scan block of the second scan chain, and
iv) receiving the signal output from the scan block in the second scan chain at the respective input of the flip-flop in each scan block of the first scan chain;
c) shifting the second logic sequence out of the second properly functioning scan chain;
d) identifying the at least one improperly functioning scan block in the first improperly functioning scan chain based on a comparison of the second logic sequence to the first logic sequence; and
e) repeating steps a) through d) for each improperly functioning scan chain.

7. The method of claim 6, further comprising:
e) shifting a third logic sequence into the first scan chain;
f) shifting a fourth logic sequence out of the first scan chain; and
g) identifying the first scan chain as an improperly functioning scan chain if the fourth logic sequence does not match the third logic sequence.

8. The method of claim 6, further comprising:
i) comparing the second logic sequence to the first logic sequence,
ii) identifying at least one difference between the second logic sequence and the first logic sequence, and
iii) identifying at least one scan block in the first improperly functioning scan chain that is associated with the at least one difference between the second logic sequence and the first logic sequence.

9. The method of claim 6, further comprising:
e) shifting a third logic sequence into the second scan chain;
f) shifting a fourth logic sequence out of the second scan chain; and
g) identifying the second properly functioning scan chain as a properly functioning scan chain if the fourth logic sequence matches the third logic sequence.

10. The method of claim 6, wherein
the first scan chain is a properly functioning scan chain,
the second scan chain is an improperly functioning scan chain,
the second logic sequence matches the first logic sequence, and
the third logic sequence is different from the second logic sequence.

11. The method of claim 6, wherein
the first scan chain is an improperly functioning scan chain,
the second scan chain is a properly functioning scan chain,
the second logic sequence is different from the first logic sequence, and
the third logic sequence matches the second logic sequence.

12. The method of claim 6, wherein step d) includes:
i) comparing the first logic sequence to the third logic sequence,
ii) identifying at least one difference between the first logic sequence and the third logic sequence, and
iii) identifying, as the improperly functioning scan block, at least one scan block associated with the at least one difference between the first logic sequence and the third logic sequence.

* * * * *